United States Patent [19]

Dietz et al.

[11] Patent Number: 5,488,082
[45] Date of Patent: Jan. 30, 1996

[54] POLYMERIC ADHESIVE PASTE

[75] Inventors: Raymond L. Dietz, Georgetown; David M. Peck, Beverly, both of Mass.

[73] Assignee: Diemat, Inc., Topsfield, Mass.

[21] Appl. No.: 390,257

[22] Filed: Feb. 17, 1995

Related U.S. Application Data

[63] Continuation-in-part of Ser. No. 100,052, Jul. 30, 1993, Pat. No. 5,391,604.

[51] Int. Cl.⁶ .............................. C08K 3/10; C08K 3/08
[52] U.S. Cl. ................................ 524/403; 524/440
[58] Field of Search ...................... 524/403, 440

[56] References Cited

U.S. PATENT DOCUMENTS

| | | | |
|---|---|---|---|
| 4,518,529 | 5/1985 | Stoetzer | 524/440 |
| 4,533,685 | 8/1985 | Hudgin et al. | 524/440 |
| 4,933,030 | 6/1990 | Dietz | 106/1.14 |
| 4,996,171 | 2/1991 | Davey et al. | 501/19 |
| 5,043,102 | 8/1991 | Chen et al. | 252/514 |
| 5,061,549 | 10/1991 | Shores | 428/207 |
| 5,155,066 | 10/1992 | Nguyen | 437/209 |
| 5,391,604 | 2/1995 | Dietz et al. | 524/403 |

*Primary Examiner*—Kriellion S. Morgan
*Attorney, Agent, or Firm*—Donald W. Huntley

[57] ABSTRACT

Adhesive paste of organic polymer resin, inorganic filler and fugitive liquid can be used for die attach applications.

18 Claims, No Drawings

POLYMERIC ADHESIVE PASTE

CROSS-REFERENCE TO RELATED APPLICATION

This application is a Continuation-In-Part of application Ser. No. 08/100,052 filed Jul. 30, 1993 now U.S. Pat. No. 5,391,604.

FIELD OF THE INVENTION

The present invention relates to an adhesive paste particularly well suited for bonding high density, microcircuit electronic components to substrates.

BACKGROUND OF THE INVENTION

The attachment of high density, microcircuit components onto substrates, such as silicon dies onto ceramic sheet, has been an important aspect of the electronics industry for many years. Generally, it is known to use a die attach paste which is deposited between the die and substrate. Typically, the die attach paste includes a filler, an adhesive and a carrier. The filler is selected to impart to the finished bonding layer desired conductive, resistive or dielectric properties. The adhesive is chosen to create a strong bond between the die and substrate. The carrier maintains all the components in a fluid, uniform mixture, which allows the paste to be applied easily to the die-substrate interface. It also has suitable volatility to migrate from between the die and substrate and leave a void-free bonding line following heat treatment of the assembly. After the paste is deposited and the die and substrate are assembled, the assembly is typically heated to fuse the adhesive and drive off the carrier. Upon cooling, the die is firmly attached to the substrate.

For the well known silver-glass pastes with organic carrier, the assembly is typically heated to as high as 450° C. U.S. Pat. No. 4,933,030 discloses a silver-glass paste for attaching high density, integrated circuits at temperatures as low as 300° C.

Silver-epoxy resin pastes have been developed to permit die attachment at still lower temperatures. However, epoxy resin pastes have certain drawbacks. Such pastes achieve their adhesive and strength properties by crosslinking of the epoxy resin. The crosslinking process is time consuming and therefore uneconomical. Adjustment of the formulation to crosslink faster reduces the working time during which the paste can be applied to the assembly, thereby complicating the process. Epoxy resins are two part systems consisting of resin and hardener which can require separate storage equipment and must be thoroughly mixed prior to use. Furthermore, epoxy resins generally crosslink to a rigid, unyielding state which can create excessive stress in especially large dies attached to high expansion substrate material. Thus, the die size that can be attached by an epoxy resin paste may be limited. Still further, as a crosslinked material, epoxy resins are not reworkable and therefore should not find appreciable use in the emerging, multi-chip module market.

Thermoplastic polymer resin adhesives can be used for die attachment. However, such adhesives suffer the drawback that they are solid at low temperatures and thus must be pre-formed to appropriate shape for each attachment application. Furthermore, solid adhesives are incompatible with the industry-standard, high speed production lines based on paste adhesives. In addition, the use of solid adhesives requires application of pressure to bring about a satisfactory bond. Attempts have been made to provide fluid adhesives based on thermoplastic polymer resins dissolved in solvents. Unfortunately, these systems also suffer from deficiencies, most notably, low upper limits on the amount of silver that can be incorporated while maintaining good adhesive and rheological properties, and the tendency of voids to form following solvent evolution unless excessively long devolatilization times are used.

SUMMARY OF THE INVENTION

The present invention provides a die attach paste which can be processed at low temperatures; is strong, yet sufficiently elastic to bond large silicon die to more expandable substrates without inducing excessive stress; which produces a void-free bonding line; is reworkable as necessary for the multi-chip market; and can be applied by equipment and processes in the industry without major modifications.

Specifically the present invention provides an adhesive paste consisting essentially of:

(A) about 10–50 volume percent organic polymer resin;
(B) up to about 40 volume percent inorganic filler; and
(C) about 30–65 volume percent fugitive liquid;

wherein each of the resin and the filler is present in particulate form of size sufficiently small to pass through a Number 325 mesh screen, and wherein the liquid and organic polymer are each substantially insoluble in the other.

In a preferred embodiment of the invention, the organic polymer resin comprises a blend of at least one thermoplastic polymer and at least one second polymer, the second polymer being present in an amount of at least about 5% of the blend.

DETAILED DESCRIPTION OF THE INVENTION

Each of the principal components of the adhesive pastes of the present invention performs the function of the corresponding component of conventional silver-glass pastes, namely, the organic polymer resin provides adhesion, the inorganic filler, if present, provides electrical or thermal conductivity properties, or both, and the liquid provides a vehicle for dispensing the paste between the die and substrate. This paste can be used in existing microcircuit assembly process equipment because it has the same rheological and flow characteristics as conventional pastes. It requires heat treatment to much lower temperatures than glass-based adhesives owing to the lower melting points of thermoplastic polymers employed. Because the organic polymer resin is present in fine particulate form and the liquid is chosen so that resin and solvent are substantially mutually insoluble, the liquid can be volatilized during heat treatment, leaving a void-free bonding line. Furthermore, because the thermoplastic resin can be repeatedly melted and solidified, the composition is reworkable and suitable for multi-chip module technology.

As used herein, the expression "consists essentially of" means that the composition may include additional components other than the principal, named components, provided that the additional components are not present in an amount sufficient to detract from the operability of the present invention.

Organic Polymer Resin

Polymer resins which can be used in this invention include any organic polymer which a) is a solid at temperatures from about room temperature up to the ambient temperature at which microcircuit electronic components operate and b) softens, upon heating to a temperature above the temperature at which microcircuit electronic components operate, to become sufficiently fluid to create an adhesive bond between the components. Epoxy resins can be used. Thermoplastic resins are preferred, which can be repeatedly fused and solidified by heating and cooling to the appropriate temperature range.

The temperature at which a thermoplastic polymer softens and becomes fluid is typically characterized by the Vicat Softening Point. The Vicat Softening Point for many common thermoplastic polymers can be obtained from references well known to those skilled in the art or from the literature provided by the polymer suppliers. Thus the practitioner of ordinary skill can readily check the suitability of a thermoplastic polymer for use in a specific die attach paste by assuring that the Vicat Softening Point lies both sufficiently above the circuitry service temperature to avoid softening during normal operation of the electronic component, and sufficiently below the desired heat treatment temperature.

Representative thermoplastic polymers which can be used include, for example, poly (phenylene sulfides), poly (ether sulfones), polyamides, polyesters, polycarbonates, polysulfones, polyacetals, polyvinyl halides, polyolefins, halogenated polyolefins, acrylic polymers, vinyl polymers and thermoplastic epoxy resins. The thermoplastic resin may be a resin which is capable of being thermoset but which is used at temperatures and conditions which will not thermoset the resin. Such resins include phenol-formaldehyde condensates, urea or melamine-formaldehyde condensates, casein, and gelatin, for example. Additional representative thermoplastic polymers which can be used include copolymers, organic or inorganic substituted polymers, and blends of two or more thermoplastic polymers.

Representative polyamides include poly(hexamethylene adipamide), poly(epsilon-caprolactam), poly(hexamethylene phthalamide and isophthalamide).

Representative polyesters include poly(ethylene terephthalate) and poly(butylene terephthalate).

The resin can contain, in addition to the thermoplastic polymer, minor amounts of additives such as adhesion promoters, thermal stabilizers, antioxidants and tackifiers. Such additives are useful for extending the upper service temperature of the thermoplastic polymer and for increasing the wetting of the surfaces of the die, substrate and inorganic filler materials by the thermoplastic polymer. Such stabilizers, adhesion promoters, antioxidants and tackifiers are well known in the art. Particularly preferred tackifiers include those commercially available from Neville as Nevtac 99 and those commercially available from Hercules as RegalRez 1018, 1085 and 1094.

The polymer resin can comprise a blend of thermoplastic polymer and up to about 50% of at least one second polymer. The second polymer can be selected from thermosetting polymers, such as epoxy resin; provided that the thermoplastic nature of the blend is retained. For example, the organic polymer resin can comprise a blend of at least one thermoplastic polymer and at least one thermoset polymer. When the thermoset polymer is an epoxy resin, the epoxy resin should be present in the blend in an amount of about from 10 to 50 volume percent. Epoxy resin can be added to the adhesive either in powder form or in liquid form as solute dissolved in the liquid.

It is important that the organic polymer resin and any filler be present in the paste in fine particulate form, occasionally referred to hereafter as "powder". Some thermoplastic resins are available from the vendor as powder. Others are typically supplied in sheet, pellet, or granular form. Thermoplastic polymer resins not supplied as powder having the desired size distribution characteristics can be comminuted by various well known techniques, such as for example, hammer milling, pin milling, abrasive wheel milling and cryogenic grinding.

The maximum particle size of organic polymer resin suitable for use in this invention is about 50 µm. The thermoplastic powder should be in the form of powder that passes through a No. 325 mesh sieve and preferably, a No. 400 mesh sieve. If the maximum powder particle size is larger than about 50 µm, appearance of the heat-treated assembly will be depreciated by surface voids in the fillets resulting from particles detaching from the adhesive surface. It has been found that larger particle size also promotes the tendency to form voids in the heat-treated bonding line. While not wishing to be bound by a particular theory, it is believed that the bonding line voids may be produced when large thermoplastic polymer resin particles hold the die away from the substrate during heat treatment. Under such conditions, liquid vaporizes from the paste, causing shrinkage parallel to the bonding line to compensate for the volume of the lost liquid. The minimum particle size of the resin is not critical and is limited by the economics of comminution.

Inorganic Filler

The inorganic filler is present in amounts of up to 40 volume %. When present, it imparts desirable thermal or electrical properties to the bonding line. Many metals or ceramics well known in the electronics industry can be used. Preferred inorganic fillers include, for example, silver, gold, copper, and nickel and alloys thereof, alumina, beryllia, silica, silicon carbide, graphite tungsten carbide, barium titanate, steatite, boron nitride, aluminum nitride and diamond. The inorganic filler also should be present in fine particulate form and the maximum particle size should be about 50 µm, and pass a 325 mesh sieve.

The filler is preferably a noble metal, and silver has been found to be particularly satisfactory. Silver powder is typically supplied in flake or spherical particle form. When supplied as flake, silver particles may have a lubricant, typically a fatty acid, such as stearic acid, on the surface as a result of the flaking process. Such lubricants normally decompose at 250° C. or lower and do not ordinarily detract from the operation of this invention. However, the presence of lubricant may affect the selection of liquid, as will be explained hereinafter. Generally, silver particulates which can be used in this invention are smaller than the thermoplastic polymer resin powder. Silvers which can be used include those having a surface area in the range of about from 0.2 to 3 m2/g and a tap density in the range of about from 2 to 5 g/cm3.

The electrically or thermally conductive inorganic filler can also be incorporated in the paste as a metal resinate, such as silver resinate or zinc resinate. In this way, the inorganic filler can be precompounded with a polymer resin or coated on polymer particles, such as spheres, prior to addition to the paste.

Liquid

The fugitive liquid in the present invention functions to suspend the other ingredients so that they can be conveniently dispensed and applied to the die and substrate. Furthermore, the liquid diffuses from the paste and vaporizes during heat treatment to provide a substantially liquid-free, treated adhesive.

The vapor pressure of the liquid should be sufficiently low that it does not rapidly evaporate from the paste at room temperature. This is to avoid reducing the "working life" of the paste. Additionally, if the vapor pressure is too high, it may vaporize during heat treatment too rapidly, which may produce a bond line containing excessive voids. The vapor pressure should be high enough to completely vaporize from the paste within a commercially practical time during heat treatment. The vapor pressure will therefore, at least in part, depend on the conditions of heat treatment. Nevertheless, because the present invention is particularly well suited to low temperature die attachment, the liquid should have room temperature vapor pressure, preferably, of less than about 50 mm Hg.

It is important that the liquid is eliminated during treatment in such a way as to provide a bonding line that is substantially free of voids. Generally, low surface tension and nonpolar liquids provide void-free bonding lines, and are therefore preferred. Representative liquids which can be used are aliphatic and aromatic hydrocarbons, and glycol ethers and their derivatives such as glycol ether acetates, having a boiling point of about from 150° C. to 275° C. Particularly satisfactory are aliphatic hydrocarbons.

It is believed that reaction between the lubricant residue normally on the surface of silver flake and the liquid may cause voids in the bond line. Thus it is desirable that the liquid used be compatible with the inorganic filler and resin in the paste to the extent that voids are not generated on removal of the solvent.

The liquid is substantially a nonsolvent for the thermoplastic polymer resin. That is, each of the resin and the liquid is not significantly soluble in the other. However, a slight solubility, up to about 20 percent of the total resin, and preferably, less than 10 percent, can be tolerated. If the liquid is more soluble in the resin, liquid may take too long to diffuse out of the fusing resin to the surface of the particles. If the resin is more soluble in the liquid, it may tend to form a film barrier which excessively retards the devolatilization of liquid from the bonding line. As heat treatment progresses in such circumstances, the liquid in the bond line vaporizes and expands to produce voids.

Generally, organic liquids known for their use in conventional, glass-filled die attachment paste, can be used in the present invention, provided that such organic liquids possess the volatility and solubility properties identified above. The liquid can be a solution of two or more liquid compounds.

Small amounts of a viscosity modifying polymer can be dissolved in the fugitive liquid to increase liquid viscosity while maintaining the volatility and solubility properties stated above. Increased liquid viscosity enhances paste rheology, i.e., thickens the paste, which improves control and versatility of paste dispensing onto the parts to be bonded. Suitable viscosity modifying polymers are substantially soluble in the fugitive liquid. Many thermoplastic elastomers are beneficial for this additive including styrene ethylene propylene block copolymers. Other representative viscosity modifying polymers include, for example, styrene-ethylene/butylene-styrene block copolymers ("SEBS") and butyl rubber. SEBS, such as Kraton™ G polymers from Shell are preferred. Kraton™ G1702X diblock styrene-ethylene-propylene has been found to be particularly satisfactory. Blends of such polymers can be used as well. The type and concentration of the viscosity modifying polymer in the liquid will affect the extent of viscosity enhancement. In general, the viscosity modifying polymer is present in the range of about from 0.5 to 5 volume %, preferably about from 1–3 volume %, and most preferably about 1.25 volume % of the fugitive liquid. Preferably, the viscosity modifying polymer is predispersed in the liquid prior to preparing the paste.

Die Attach Adhesive and Use

A particular advantage of this die attach adhesive is its similarity in performance to conventional, glass-based adhesive pastes, except for its ability to undergo heat treatment at relatively low temperatures. Therefore the preparation of the adhesive from its principal components, and its methods of application and use, take advantage of the various methods and employ equipment well known in the art. In effect, this die attach adhesive is a low treatment temperature, "drop-in" replacement for inorganic- (i.e., glass-) based die attach and thick film pastes.

The die attach adhesive of the present invention is a uniform mixture of polymer resin, inorganic filler and liquid. The principal components can be mixed in equipment known in the art for paste preparation. It should be recognized that thermoplastic polymers chosen for a specific paste application will have significantly lower fusion point than the glass of conventional pastes. Accordingly, it may be necessary to operate the mixing apparatus at slower speed and/or less intense agitation; with slightly smaller recipe of ingredients; with cooling; or with a combination of the preceding, in order to avoid coalescing of the thermoplastic polymers. These techniques may be necessary to assure that the thermoplastic polymer resin is present in fine particulate form prior to heat treatment.

The order of mixing the ingredients is not critical. All the principal components can be blended together. Alternatively, combinations of two principal components can be premixed followed by addition of other components to produce the paste. For example, it may be desired to first produce a dry blend of the thermoplastic polymer resin and the inorganic filler by known methods of powder mixing, such as by using ribbon or double-cone tumble blenders. Thereafter, liquid can be added to the dry mixture to form the paste.

The adhesive composition prior to heat treatment will preferably contain about 24–37 volume % inorganic filler. Preferably, the composition will contain 11–37 volume % and more preferably, 13–29 volume % thermoplastic polymer resin.

It is known that thermoplastic polymers typically have maximum service temperatures above which they degrade, increasingly decomposing as the combination of high temperature and exposure time becomes more severe. The ordinary skilled practitioner will appreciate that heat treatment temperature cycles customary for glass pastes should be adjusted to avoid degradation of the thermoplastic polymer.

The liquid also should provide a smooth paste which dispenses cleanly to the bond line without dripping or tailing. Normally, the viscosity of the paste can be adjusted by changing the proportions of ingredients, as will be evident to the skilled practitioner.

The die attach adhesive of this invention is also useful in many thick film paste applications, such as for example, the fabrication of hybrid circuits in which conductive, resistive and dielectric pastes are screen printed onto substrate materials and heat treated to bond the desired printed circuit to the substrate.

The die attach adhesive of the present invention is typically used for attaching microcircuit electronic components to a substrate. In general, this comprises making an adhesive paste of the present invention; followed by applying the paste to a surface of a substrate to form a bond line and placing the electronic component on the bond line so that the paste is between the electronic component and the substrate; followed by heating the assembly to a sufficiently high temperature for a sufficient time that the thermoplastic resin softens and becomes fluid, but does not degrade, and the liquid devolatilizes from the paste; followed by cooling the heat-treated assembly to a temperature below which the thermoplastic polymer becomes solid, whereby the microcircuit electronic component is bonded to the substrate by a void-free bond line.

EXAMPLES

This invention is now illustrated by examples of certain representative embodiments thereof, where all parts, proportions, and percentages are by volume unless otherwise indicated. The examples are intended to be illustrative only, and modifications and equivalents of the invention will be evident to those skilled in the art. All units not originally obtained in SI units have been converted to SI units.

The materials used in the examples are summarized in Table I. Thermoplastic polymer resins were supplied by the vendor in powder form or in sheet or pellet form. Those supplied as sheets or pellets were ground to powder form using a high rotation speed, abrasive wire wheel. All thermoplastic polymer resin powders were passed through 325 mesh screen sieves to assure that maximum particle size was less than 50 µm.

EXAMPLES 1–19 AND COMPARATIVE EXAMPLES A–F

Filler was first combined with a portion of liquid to make a blend of about 37–44 % filler. The blend was processed on a 3-roll mill to uniformly disperse the materials and form a filler paste. The filler paste was combined with sufficient organic polymer resin and additional liquid to produce a blend of composition as indicated in Table II. This blend was processed on a 3-roll mill to produce a substantially uniform concentration, die attach paste.

To measure bond strength, 13 microliters of die attach paste was deposited on a bare ceramic sheet. An 8.6 mm × 8.6 mm, silicon die was placed over the paste. The assembly was heated in a furnace at an average rate of 10° C. per minute until the temperature indicated in Table II was reached. The sample was maintained at temperature for the duration also indicated in the table. Thereafter, the sample was removed from the furnace and cooled to room temperature. An aluminum stud was fastened to the die with epoxy adhesive and pulled off with a Sebastian III stud puller. Bond strength was recorded directly from the stud puller. To measure voids created in the bond line, a transparent glass microscope slide was substituted for the die and the procedure was repeated except that 70 microliters of paste was placed on the ceramic sheet. The glass slides used for voiding experiments were 18 mm × 18 mm in size. Voids were characterized by visual inspection.

Results of the examples are also summarized in Table II. Table II is listed by volume percent to accommodate the densities of the various filler materials that could be used. Bond strength was considered good if it exceeded about 4.5 kg to about 6.8 kg (10–15 lbs). Examples 1 and 2 demonstrate that the die attach paste of the present invention can produce strong, void-free bonds at heat treatment of short duration at 290° C. and slightly longer at 350° C. In Comparative Examples A and B, the thermoplastic polymer resin of Examples 1 and 2 was diluted with 20 % of polysulfone predissolved in methyl benzoate. Void formation was massive but reduced to a still unacceptable, but moderate amount, as the percent of resin in solution decreased. A smaller amount of polysulfone produced void-free bond lines in Example 3–5, which also show decreasing bond strength with decreasing resin amount. In Example 6, 20% polysulfone produced a satisfactory bond line because the amount of total resin was in solution reduced.

Comparative Example C demonstrates the performance of epoxy as the polymer resin. Epoxy is a thermosetting polymer, consequently, the bond strengths are too low. Bond strengths improve with increasing amounts of epoxy. However, strength is only marginal at over 30% epoxy in the paste.

Examples 9–11 show that the present invention can produce marginally strong bond lines at less than 200° C. heat treatment.

Examples 12–19 demonstrate effectiveness of this invention at producing strong, void-free bonds at treatment temperatures in the range of 150°–250° C. As temperature is lowered, treatment time is extended. Also, bond strength decreases with reduced thermoplastic polymer resin content. Resistivity of Example 18 was measured as 57×10-6 ohm-cm, which is higher than that of glass-based pastes but much lower than that of typical epoxy-based pastes.

Comparative Example D shows that excessive solubility between liquid and resin produces massive voiding of the bond line. Massive voiding is seen in Comparative Examples E and F, which is believed to be due to the incompatibility of the solvent with the silver flake surfactant.

TABLE I

| Thermoplastic Polymer Resin | |
|---|---|
| TP1 | UDEL P3703 (Amoco) Polysulfone |
| TP2 | UDEL P1800 (Amoco) Polysulfone |
| TP3 | Ultrason E (BASF) Poly(ether sulfone) |
| TP4 | Fortron (Hoechst) Poly(phenylene sulfide) |
| TP5 | MR11 (Phillips) Poly(phenylene sulfide) |
| TP6 | V1 (Phillips) Poly(phenylene sulfide) |
| TP7 | GR01 (Phillips) Poly(phenylene sulfide) |
| TP8 | Siltem (General Electric) Poly(etherimide siloxane) |
| TP9 | 5183 (Bostik) Polyester |
| TP10 | 5157 (Bostik) Polyester |
| Liquid | |
| L1 | EXXAL #9 (Exxon) isononyl alcohol |
| L2 | NMP (Aldrich) methyl pyrrolidone |
| L3 | Methyl benzoate |
| L4 | Terpineol 318 (Hercules) terpene alcohol |
| L5 | 673 (Exxon) Dearomatized aliphatic |
| L6 | 686 (Exxon) Dearomatized aliphatic |
| L7 | Suresol 157 (Koch) aromatic diisopropyl benzene |
| L8 | DBE (DuPont) aliphatic dibasic ester |
| L9 | Norpar 15 (Exxon) aliphatic hydrocarbon |
| Inorganic filler | |
| F1 | 15ED #001 (Metz) Silver flake |
| F2 | 15ED #173 (Metz) Silver flake |
| F3 | 3000-1 (Metz) Silver powder |
| F4 | EA295 (Chemet) Silver flake |
| F5 | Boron nitride |
| F6 | Graphite |
| F7 | Aluminum Oxide |
| F8 | Copper |
| F9 | Nickel |
| F10 | Aluminum nitride |
| F11 | Silver/copper alloy |
| F12 | Metz #80 Silver flake |
| F13 | Metz #67 Silver flake |
| Thermoset Polymer Resin | |

TABLE I-continued

| | |
|---|---|
| TS1 | Epoxy 7P3000-G |
| TS2 | Epoxy LE3000-G |
| TS3 | Epoxy DK8-BLUE |
| TS4 | Epoxy Farboset 9146 | rod connected to an Ametek force gauge was inserted in a predrilled hole. Using a drill press to force the rod against the resistor, the adhesion force at bond failure was determined as shown in Table III.

TABLE II

| Example | Thermoplastic Polymer Resin | | Liquid | | Filler | | Heat Treatment | | Voids in | Bond Adh |
|---|---|---|---|---|---|---|---|---|---|---|
| | Type | Vol % | Type | Vol % | Type | Vol % | minutes | °C. | Bond Line | (kg) |
| 1 | TP5 | 21.8 | L3 | 54.8 | F4 | 23.4 | 2 | 290 | None | 11.8 |
| A | 80% TP5/20% TP2 | 21.8 | L3 | 54.8 | F4 | 23.4 | 2 | 290 | High | 51.8 |
| B | 80% TP5/20% TP2 | 19.2 | L3 | 60.2 | F4 | 20.6 | 5 | 350 | Moderate | 52.7 |
| 2 | TP5 | 19.2 | 50% L8/ 50% L4 | 60.2 | F4 | 20.6 | 5 | 350 | None | 35.5 |
| 3 | 90% TP5/10% TP2 | 19.2 | L3 | 60.2 | F4 | 20.6 | 5 | 350 | None | 39.1 |
| 4 | 90% TP5/10% TP2 | 17.2 | L3 | 59.2 | F4 | 23.6 | 5 | 350 | None | 37.7 |
| 5 | 90% TP5/10% TP2 | 14.0 | L3 | 59.8 | F4 | 26.2 | 5 | 350 | None | 15.0 |
| 6 | 80% TP5/20% TP2 | 13.4 | L3 | 61.5 | F4 | 25.1 | 5 | 350 | None | 24.1 |
| C | TS4 | 12.3 | L5 | 52.5 | F4 | 35.2 | 5 | 305 | None | 4.1 |
| 7 | TS4 | 22.2 | L5 | 47.4 | F4 | 30.4 | 5 | 305 | None | 5.5 |
| 8 | TS4 | 30.4 | L5 | 43.1 | F4 | 26.5 | 5 | 305 | None | 7.3 |
| 9 | TP9 | 17.5 | L5 | 49.8 | F4 | 32.7 | 8 | 175 | None | <4.5 |
| 10 | TP9 | 21.7 | L5 | 48.5 | F4 | 29.8 | 8 | 175 | None | 6.4 |
| 11 | TP9 | 25.4 | L5 | 47.4 | F4 | 27.2 | 8 | 175 | None | 8.6 |
| 12 | TP9 | 25.4 | L7 | 47.4 | F4 | 27.2 | 20 | 150 | None | 12.7 |
| 13 | TP9 | 25.4 | L5 | 47.4 | F4 | 27.2 | 10 | 250 | None | 12.3 |
| 14 | TP9 | 25.4 | L5 | 47.4 | F4 | 27.2 | 2 | 200 | None | 31.8 |
| 15 | TP9 | 25.4 | L5 | 47.4 | F4 | 27.2 | 24 | 175 | None | 25.9 |
| 16 | TP9 | 25.4 | L5 | 47.4 | F2 | 27.2 | 25 | 175 | None | 25.9 |
| 17 | TP9 | 21.3 | L5 | 49.6 | F2 | 29.1 | 25 | 175 | None | 29.5 |
| 18 | TP9 | 16.7 | L5 | 52.1 | F2 | 31.2 | 25 | 175 | None | 20.5 |
| 19 | TP9 | 11.7 | L5 | 54.8 | F2 | 33.5 | 25 | 175 | None | 7.3 |
| D | TP9 | 15.9 | L3 | 62.3 | F2 | 21.8 | 25 | 175 | High | <4.5 |
| E | TP2 | 16.0 | L1 | 66.8 | F1 | 17.2 | 5 | 350 | High | 8.6 |
| F | TP3 | 16.0 | L1 | 66.8 | F1 | 17.2 | 5 | 350 | High | 18.2 |

EXAMPLES 20–29

Adhesive pastes were prepared as in Examples 1–19 from the materials listed in Table I in proportions shown in Table III. The ratio of filler to organic polymer resin was 87:13 parts by volume. In each of these examples, the filler was a 50/50 blend, by weight, of F12 and F13, and 42 volume % of liquid L9 were used. In all cases, silver resinate (Engelhard #9144) was added to the liquid in the amount of 3% by weight.

The pastes were tested for chip resistor adhesion as follows. Holes of 1.6 mm (1/16 inch) diameter were drilled between each set of tinned pads on a printed circuit board adapted to receive 1206 chip resistors. The board and pads were washed with acetone and the pads were abraded slightly. Three layers of 0.064 mm (2.5 mil) thick pressure sensitive adhesive tape was placed on the board over the region where the chip resistors would be attached. The tape over the attachment sites was cut with a knife and removed. The cut out sites were arranged in a daisy chain pattern to permit a continuous electrical circuit through multiple resistors for contact resistance testing. Adhesive paste was applied to the boards with a doctor blade, then the tape was removed to leave a paste thickness of 0.14–0.15 mm (5.5–6.0 mils). Type 1206 chip resistors were manually placed on the board overlying the holes and with only terminations contacting the paste. The boards were fired at 175° C. for dwell time of 8 minutes, unless otherwise noted in Table III.

The fired boards were set, resistors facing down, on ceramic spacers and a 1.6 mm (1/16 inch) diameter extender

EXAMPLE 30

Adhesive paste was prepared as in Examples 1–19 with no filler and wherein the organic polymer resin was entirely TP9.

After firing at 150° C. with a dwell time of 12 minutes, the paste produced an adhesive strength of 2.72 kg in the 1206 chip resistor adhesion test as in Examples 20–26.

The paste was also tested as a sealing material for a ceramic lid. 50 μL of the paste was dispensed uniformly around the gold plated seal ring of each of standard ceramic side braze packages which were then fired at 150° C. for 15 minutes to remove volatile components. A ceramic lid was assembled on each package covering the once fired, seal ring. While clamped under 0.68 kg (1.5 lbs) pressure, the assemblies were again fired at 150° C. for 15 minutes to produce a sealed cavity within the package. Packages passed standard military specification hermetic seal testing at –65, 25 and 125° C., i.e., they were found to have low leak rates.

EXAMPLES 31–34 AND COMPARATIVE EXAMPLES G TO I

Adhesive pastes were prepared as in Examples 1–19, except that amounts of viscosity modifying polymers, as shown in the following table, were dissolved in the fugitive liquid prior to mixing the paste.

| Example | Viscosity Modifying Polymer | Vol. % Polymer in fugitive liquid |
|---|---|---|
| 31 | SEP (Kraton ™ G1702X) | 1.25 |
| 32 | SEBS (Kraton ™ G1654X) | 3.00 |
| G | SEBS (Kraton ™ G1657) | 5.00 |
| 33 | SEP (Kraton ™ G1701X) | 2.50 |
| H | SEBS (Kraton ™ G1765X) | 5.00 |
| I | Butyl Rubber | 5.00 |
| 34 | Exxon Vistalon ™ 3708 | 3.50 |

The compositions of Examples 31–34 provided satisfactory to excellent adhesive performance.

TABLE III

ORGANIC POLYMER RESIN

| Example No. | Thermoplastic Polymer Resin | Thermoset Polymer Resin | Thermoplastic Resin: Thermoset Resin Parts/vol | Adhesion (kg) |
|---|---|---|---|---|
| 20 | TP9 | None | 100:0 | 1.68 |
| 21 | None | TS1 | 0:100 | 1.46* |
| 22 | None | TS2 | 0:100 | 1.67 |
| 23 | None | TS3 | 0.100 | 1.08* |
| 24 | TP9 | TS3 | 50:50 | 2.22 |
| 25 | TP9 | TS2 | 50:50 | 1.60 |
| 26 | TP9 | TS1 | 50:50 | 2.30 |
| 27 | TP9 | TS1 | 65:35 | 2.13 |
| 28 | TP9 | TS1 | 80:20 | 1.82 |
| 29 | TP9 | TS1 | 90:10 | 2.53 |

*Fired at 150° C., dwell time 12 minutes

We claim:

1. An adhesive paste consisting essentially of:

(A) about 10–50 volume percent at least one organic polymer resin;

(B) up to about 40 volume percent inorganic filler; and (C) about 30–65 volume percent fugitive liquid;

wherein each of the resin and the filler is present in particulate form of size sufficiently small to pass through a Number 325 mesh screen, and wherein the liquid and organic polymer resin are each substantially insoluble in the other.

2. An adhesive paste of claim 1 wherein the organic polymer resin consists essentially of thermoplastic polymer.

3. An adhesive paste of claim 1 wherein the organic polymer resin comprises a blend of at least one thermoplastic polymer and at least one second polymer, the second polymer being present in an amount of at least about 5% of the blend.

4. An adhesive paste of claim 1 wherein the second polymer comprises at least one thermosetting polymer.

5. An adhesive paste of claim 4 wherein the second polymer consists essentially of epoxy resin.

6. An adhesive paste of claim 5 wherein the epoxy resin comprises at least about 10 volume percent of the blend.

7. An adhesive paste of claim 1 wherein the fugitive liquid comprises an effective amount of at least one viscosity modifying polymer.

8. An adhesive paste of claim 5 wherein the viscosity modifying polymer comprises about from 0.5 to 5 volume % of the fugitive liquid.

9. An adhesive paste of claim 8 wherein the viscosity modifying polymer comprises less than about 3 volume % of the fugitive liquid.

10. An adhesive paste of claim 7 wherein the viscosity modifying polymer consists essentially of thermoplastic elastomer.

11. An adhesive paste consisting essentially of:

(A) about 10–50 volume percent organic polymer resin;

(B) up to about 40 volume percent inorganic filler; and (C) about 30–65 volume percent fugitive liquid;

wherein each of the resin and filler is present in particulate form of size sufficiently small to pass through a Number 325 mesh screen, wherein the liquid and thermoplastic polymer are each substantially insoluble in the other; and wherein the fugitive liquid comprises an effective amount of at least one viscosity modifying polymer to increase the viscosity of the liquid.

12. An adhesive paste of claim 11 wherein the viscosity modifying polymer comprises about from 0.5 to 5 volume % of the fugitive liquid.

13. An adhesive paste of claim 12 wherein the viscosity modifying polymer is selected from the group consisting of thermoplastic elastomer.

14. An adhesive paste of claim 13 wherein the viscosity modifying polymer consists essentially of styrene ethylene propylene block copolymer.

15. An adhesive paste of claim 1 further comprising about from 0.5 to 5 volume %, based on the fugitive liquid, of metal resinate.

16. An adhesive paste of claim 15 wherein the metal resinate is selected from the group consisting of silver resinate and zinc resinate.

17. An adhesive paste of claim 16 wherein the metal resinate consists essentially of silver resinate.

18. An adhesive paste of claim 12 wherein the viscosity modifying polymer is less than about 3 volume % of the fugitive liquid.

\* \* \* \* \*